(12) United States Patent
Tsui et al.

(10) Patent No.: US 6,967,475 B2
(45) Date of Patent: Nov. 22, 2005

(54) DEVICE TRANSFER MECHANISM FOR A TEST HANDLER

(75) Inventors: Ching Man Stanley Tsui, Kwai Chung (HK); Chak Tong Albert Sze, Kwai Chung (HK); Pei Wei Tsai, Kwai Chung (HK); Lap Kei Eric Chow, Kwai Chung (HK)

(73) Assignee: ASM Assembly Automation Ltd., Hong Kong (HK)

( * ) Notice: Subject to any disclaimer, the term of this patent is extended or adjusted under 35 U.S.C. 154(b) by 0 days.

(21) Appl. No.: 10/763,503

(22) Filed: Jan. 22, 2004

(65) Prior Publication Data

US 2005/0162151 A1   Jul. 28, 2005

(51) Int. Cl.[7] ............................................. G01R 31/26
(52) U.S. Cl. ............... 324/158.1; 324/765; 414/223.01
(58) Field of Search ........................... 324/158.1, 760, 324/765; 414/222.01, 223.01, 223.02, 749.4, 414/788.7, 793, 795; 198/496.1, 470.1, 471.1, 198/478.1

(56) References Cited

U.S. PATENT DOCUMENTS

| | | | |
|---|---|---|---|
| 5,617,945 A | | 4/1997 | Takahashi et al. ........ 198/471.1 |
| 5,789,685 A | * | 8/1998 | Fukumoto .................. 73/865.8 |
| 5,920,192 A | * | 7/1999 | Kiyokawa ................ 324/158.1 |
| 5,957,305 A | * | 9/1999 | Takahashi ................... 209/573 |
| 6,019,564 A | * | 2/2000 | Kiyokawa et al. ...... 414/223.01 |
| 6,313,654 B1 | * | 11/2001 | Nansai et al. ............... 324/760 |

* cited by examiner

*Primary Examiner*—Minh N. Tang
(74) *Attorney, Agent, or Firm*—Ostrolenk, Faber, Gerb & Soffen, LLP

(57) ABSTRACT

The invention provides a mechanism for a test handler using for electrical testing of electronic devices. The devices are placed on a platform configured to move semiconductor devices from an onloading position to an offloading position along a predetermined path. A transfer arm with a plurality of transfer heads connected to it is located adjacent the path. The transfer heads are configured to pick up and transfer semiconductor devices from the platform to a testing position for testing, and thereafter to transfer the semiconductor devices from the testing position to the platform for offloading.

24 Claims, 4 Drawing Sheets

DEVICE TRANSFER MECHANISM FOR A TEST HANDLER

FIELD OF THE INVENTION

The invention relates to a mechanism for moving devices, in particular semiconductor or integrated circuit ("IC") devices, between different locations in a test handler used for testing the devices.

BACKGROUND AND PRIOR ART

In the automated assembly and packaging of semiconductor or IC devices, the function of a test handler is to test the packaged devices, preferably after they are separated both electrically and physically from one another. There are many types of IC packages in the art, such as chip-scale packages. Commonly, the packaged devices are tested in bulk in order to increase throughput and thus a plurality of these packages need to be handled together simultaneously. As these packages are getting ever-smaller in size, the task of handling them properly and efficiently becomes more difficult and complex.

Typically, the packages are transferred from an input position, moved near to a tester, precisely positioned and aligned with respect to a test contactor of the tester, tested and then moved to an output location for further downstream processing or binning.

An example of a prior art test handler transfer mechanism is disclosed in U.S. Pat. No. 5,617,945 entitled "Device Transfer Mechanism for IC Test Handler". The device transfer mechanism includes a circular-orbit rotation table with multiple pockets that store the devices by a unit of n pieces on the rotation table, and at least three horizontally-disposed rotation arms each of which has a contact arm with a suction section that sucks the devices by a unit of n pieces at the tip of each arm. The rotation arms pick up the devices and place them onto a measurement section for electrical testing. After electrical testing, the devices are lifted from the measurement section for removal. A horizontally-disposed rotation storage arm is additionally provided to transfer the devices by arranging multiple arms with pockets that store devices by a unit of n pieces at the tip of each rotation storage arm.

This design requires too many rotation arms. In particular, the additional rotation storage arm is used as a receiving buffer though dispensing with it would simplify the mechanism. With more components comprised in the transfer mechanism, there is a correspondingly increased risk of failure. Since the rotation table and sets of separate rotation arms are all horizontally disposed, the total area required to house the mechanism is relatively large.

SUMMARY OF THE INVENTION

The invention seeks to provide an improved transfer mechanism with a simpler structure by reducing the number of transfer components. Thus, it also seeks to occupy a smaller area as compared to the prior art while providing greater alignment precision.

According to a first aspect of the invention, there is provided a test handler comprising: a platform configured to move semiconductor devices placed on the platform from an onloading position to an offloading position along a predetermined path; a transfer arm located adjacent the path; and a plurality of transfer heads connected to the transfer arm that are configured to pick up and transfer semiconductor devices from the platform to a testing position for testing, and thereafter to transfer the semiconductor devices from the testing position to the platform for offloading.

According to a second aspect of the invention, there is provided a method for testing semiconductor devices with a test handler comprising the steps of: placing the semiconductor devices onto an onloading position of a platform; moving the semiconductor devices along a predetermined path; picking up and transferring semiconductor devices along the path from the platform to a testing position with one of a plurality of transfer heads; testing the semiconductor devices; transferring the semiconductor devices from the testing position to the platform; and thereafter moving the semiconductor devices to an offloading position for removal from the platform.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus and method according to the preferred embodiment of the invention will now be described with reference to the accompanying drawings, in which.

DETAILED DESCRIPTION OF THE PREFERRED EMBODIMENT

Figure 1:
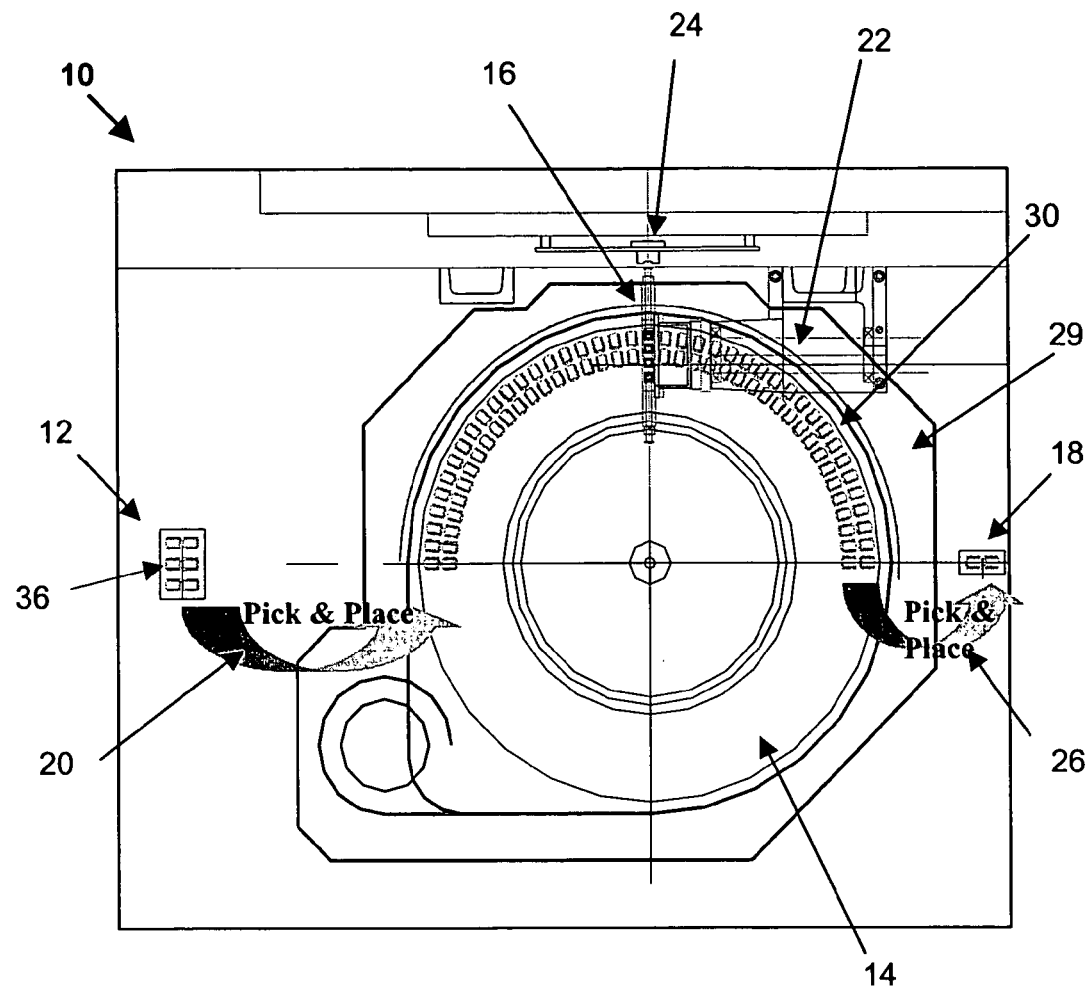
FIG. 1 is a plan view of a test handler illustrating the layout of a device transfer mechanism according to the preferred embodiment of the invention.

FIG. 1 is a plan view of a test handler 10 illustrating the layout of a device transfer mechanism according to the preferred embodiment of the invention. The test handler 10 includes an input buffer 12 at an input location, a thermally-enclosed section surrounded by a thermal insulation wall 29, a platform in the form of a round turntable 14, a transfer arm in the form of a rotary transfer arm 16 and an output buffer 18 at an output location.

Semiconductor or IC devices 36 are placed into the input buffer 12 from an upstream process. The input buffer 12 consists of several columns of pockets for holding and staging the devices 36. The devices 36 are moved by an onloading transfer arm 20 to an onloading position on the turntable 14. The onloading transfer arm 20 comprises a number of suction pick heads. In a typical cycle, the onloading transfer arm 20 moves over the input buffer 12, positions its pick heads directly above the devices 36, moves down and picks up the devices 36 using suction force. It then moves up and over to the turntable 14.

The turntable 14 comprises a number of carriers 30 sitting on it, wherein each carrier 30 has a number of device holders such as cells 31 formed in it. Each carrier 30 has multiple columns of cells 31 for receiving and holding multiple devices 36. The turntable 14 moves the devices from the onloading position to an offloading position along a predetermined path as defined by the path by which each carrier 30 travels around the turntable 14. The turntable 14 is also a thermal conditioning mechanism in which the carriers 30 may be heated or cooled, and then maintained at a certain set temperature. The turntable 14 rotates incrementally at a predetermined rate. Therefore, devices 36 that are placed on the turntable 14 from the input buffer 12 can be heated or cooled to the predetermined temperature of the carriers 30 by the time the devices 36 reach the testing area.

Preferably, the number of devices 36 picked by the onloading transfer arm 20 in each pick-and-place motion equals the number of cells 31 found in each carrier 30. The onloading transfer arm 20 positions its pick head directly above cells 31 on the turntable 14. It then moves down and releases the units onto the cells 31. The turntable 14 is moved incrementally to transfer the devices 36 to the position of the rotary transfer arm 16, which is supported by a rotary transfer arm stand 22. The rotary transfer arm 16 is located adjacent the carriers 30 or predetermined traveling path of the devices 36 so as to pick up the devices from the turntable 14.

At the rotary transfer arm 16, a plurality of devices 36 located in the carriers 30 are picked up at the same time, and the devices 36 are precisely positioned and aligned so as to be ready for testing by test contactors of a tester 24 at a testing position. After testing by the tester 24, the devices 36 are placed back onto the turntable 14 and moved towards the offloading transfer arm 26. The offloading transfer arm 26 picks up devices 36 from the carriers 30 and transfers them to the output buffer 18. These devices 36, which have been tested, may be moved downstream for further processing or binned as desired.

Figure 2:
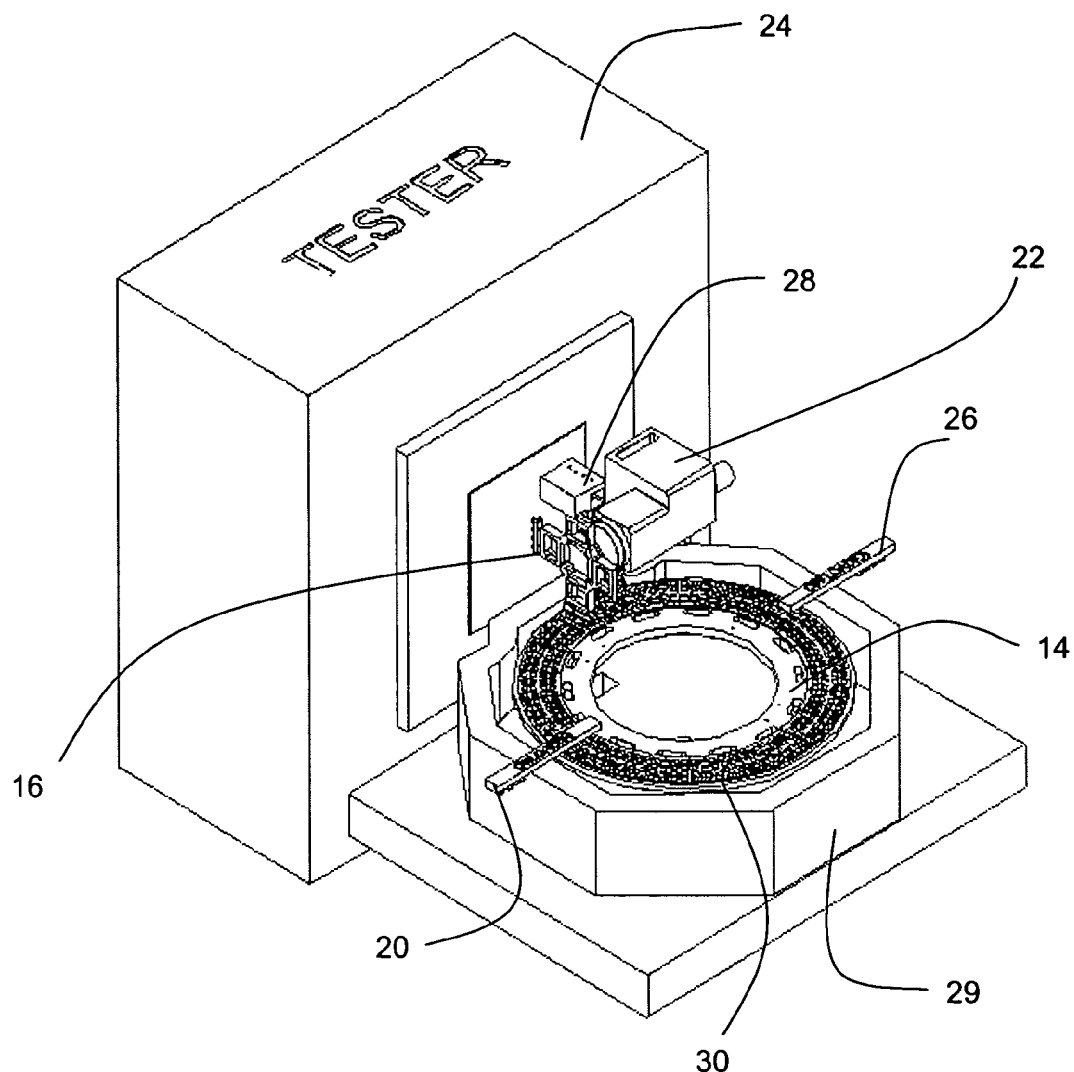
FIG. 2 is an isometric view of the test handler and device transfer mechanism of FIG. 1.

FIG. 2 is an isometric view of the test handler 10 and device transfer mechanism of FIG. 1. A device precision station 28 is shown which is used for precisely positioning and aligning devices 36 before testing. Therefore, the devices 36 are transferred to the device precision station 28 first for alignment, and thereafter transferred to the tester 24. It may comprise an optical system to perform the alignment. Also illustrated is the thermal insulation wall 29 that serves to help maintain the devices 36 at a predetermined testing temperature. The thermal insulation wall 29 helps to reduce interference by the ambient temperature when heating or cooling the devices 36 using the carriers 30. Since only the turntable 14 needs to be enclosed by the thermal insulation wall 29 using this design, the thermal insulation wall 29 may bound only a perimeter of substantially an area occupied by the turntable 14, thus reducing an overall footprint of the test handler 10.

Figure 3:
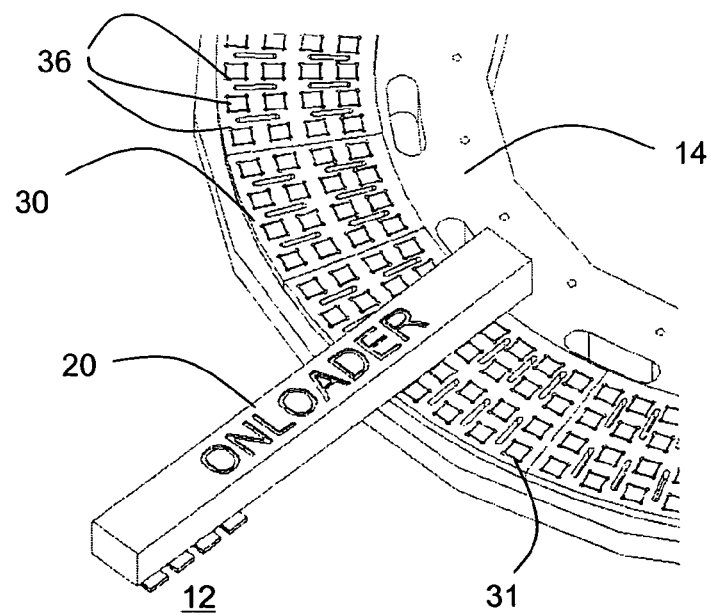
FIG. 3 is an isometric view of an onloading transfer arm for transferring devices from an input location onto a turntable of the device transfer mechanism.

FIG. 3 is an isometric view of an onloading transfer arm 20 for transferring devices 36 from an input location onto a turntable 14 of the device transfer mechanism. The onloading transfer arm 20 picks up devices 36 from the input buffer 12 by exerting a suitable holding force, such as by vacuum suction from suction pick heads (not shown). The onloading transfer arm 20 and its suction pick heads may be adapted to move between the input buffer 12 and a position over the turntable 14. The devices 36 are arranged for placement onto corresponding cells 31 formed on the carriers 30 on the turntable 14. The devices 36 are placed onto the cells 31 before they are moved away by rotation of the turntable 14 towards the rotary transfer arm 16 next to the tester 24.

Figure 4:
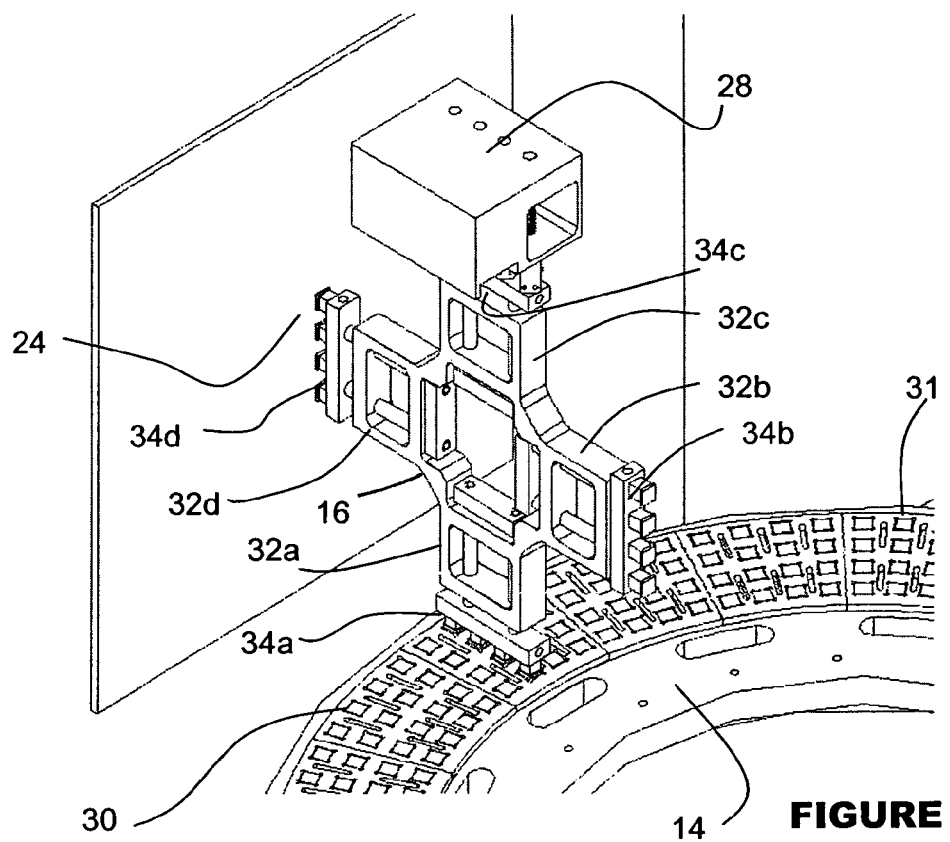
FIG. 4 is an isometric view of a rotary transfer arm of the device transfer mechanism that is adapted to hold devices for testing by the tester.

FIG. 4 is an isometric view of a rotary transfer arm 16 of the device transfer mechanism that is adapted to hold devices 36 for testing by the tester 24. The rotary transfer arm stand 22 (see FIG. 1) has been removed for clarity. The rotary transfer arm 16 has a single vertical rotary mechanism and has four sets of transfer arm linkages 32a, 32b, 32c, 32d. Connected to the transfer arm linkages are four sets of transfer heads 34a, 34b, 34c, 34d. Each transfer head 34a, 34b, 34c, 34d has a number of transfer ports which may comprise suction ports, each of which is configured to hold one device 36. A number of transfer or suction ports is provided on each transfer head to correspond to the number of devices 36 to be picked up at one time. In the illustration, four devices 36 can be picked up by each transfer head 34a, 34b, 34c, 34d. As shown in FIG. 4, the transfer heads 34a, 34b, 34c, 34d are arranged on a plane that is substantially perpendicular to the predetermined path traveled by the devices 36. The vertically-disposed rotary transfer arm 16 serves to reduce the area to be surrounded by the thermal insulation wall 29 and the overall system footprint as compared to the prior art.

The sequence of actions is as follows. The turntable 14 is moved so that a row of devices 36 are positioned under the transfer head 34a. The transfer head 34a is lowered to pick up the devices. The rotary transfer arm 16 is rotated anti-clockwise by 90°, so that another transfer head 34d is positioned over the carrier 30 of the turntable 14. The turntable 14 is moved incrementally so that a row of devices 36 is positioned under the transfer head 34d. The transfer head 34d is lowered to pick up this row of devices 36.

The rotary transfer arm 16 is rotated anti-clockwise by 90° again so that the first transfer head 34a is now adjacent to the device precision station 28. The devices on the first transfer head 34a are aligned. Consecutively, the rotary transfer arm 16 can be lowered to pick another row of devices 36 with a transfer head 34c. Thereafter, the rotary transfer arm 16 is rotated by another 90° so that the first transfer head 34a is adjacent the tester 24. The first transfer head 34a is then plunged forward so that the devices 36 on the transfer head 34a can make electrical contact with the test contactor of the tester 24. Testing can then commence. Picking up additional rows of devices 36, aligning devices 36 at the device precision station 28 and testing at the tester 24 can be done either concurrently or consecutively at the respective transfer heads 34a, 34b, 34c, 34d.

After testing, the rotary transfer arm 16 is rotated anti-clockwise by 90° so that the first transfer head 34a holding tested devices 36 is positioned over a row of cells 31 of a carrier 30 which have just been emptied by a preceding transfer head 34b that has picked up a row of devices 36. The first transfer head 34a is lowered and a row of devices 36 is released onto the turntable 14. This completes one cycle of movement of a transfer head, and the turntable 14 is moved incrementally again for the first transfer head 34a to pick up another row of devices 36 for testing. By repeating these steps and rotating the rotary transfer arm 16 by 90° each time, devices 36 may be continually picked from the turntable 14, aligned, tested and returned to the turntable 14. The tested devices 36 are then moved towards the offloading transfer arm 26.

Figure 5:
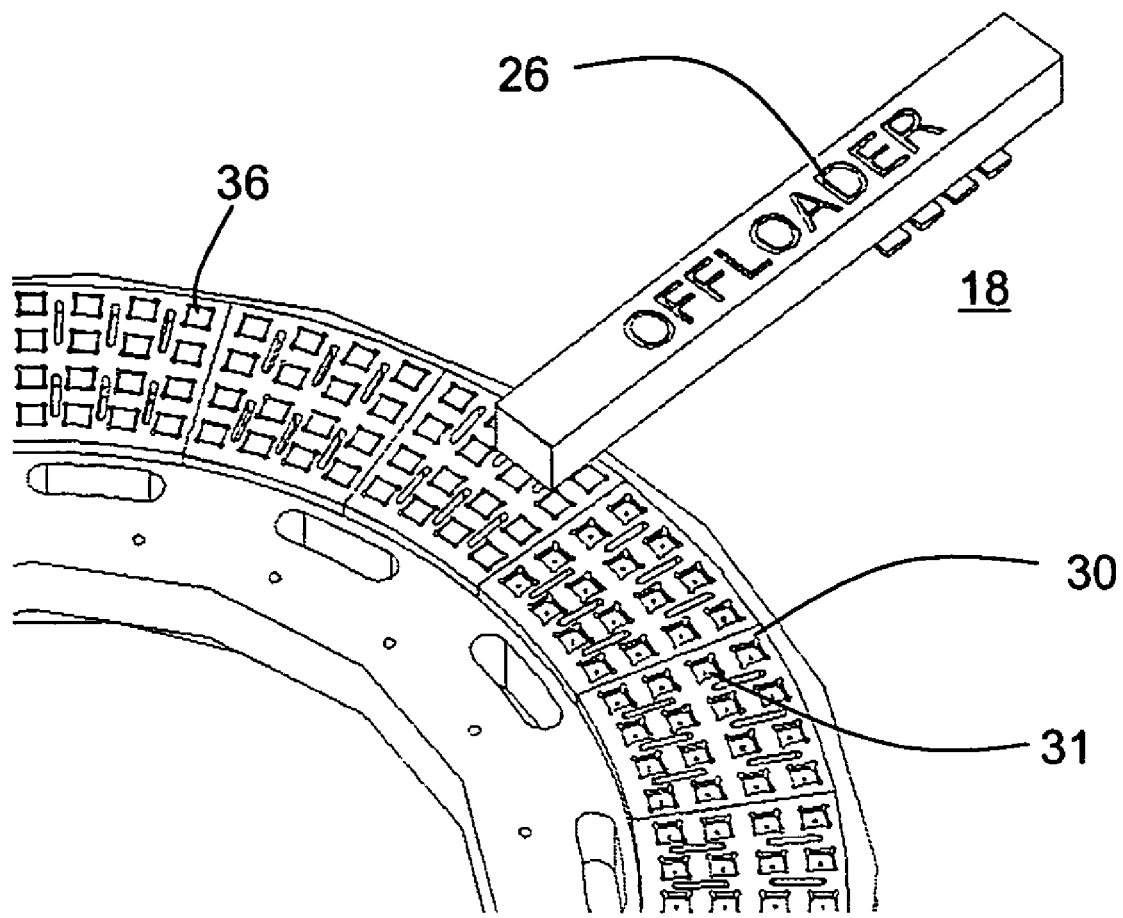
FIG. 5 is an isometric view of an offloading transfer arm for transferring devices from the turntable to an output location.

FIG. 5 is an isometric view of an offloading transfer arm 26 for transferring devices 36 from the turntable 14 to an output location. The output location includes an output buffer 18. The output buffer 18 consists of several columns of pockets to act as a buffer for tested devices 36 that are offloaded from the turntable 14. The offloading transfer arm 26 may have the same mechanism as the onloading transfer arm 20 as described with respect to FIG. 3 above, as its function is similar.

The offloading transfer arm 26 comprises a number of suction pick heads. In a typical cycle, the offloading transfer arm 26 moves over the turntable 14 and positions itself directly above a number of devices 36 equivalent to the number of its pick heads, moves down and picks up the devices 36 using suction force. Rows of devices 36 are lifted from the cells 31 on the turntable and moved towards the output buffer 18. In this case, each row of four devices may be moved at a time, corresponding to the number of cells formed in one or more rows of the carriers 30. It then moves up and over to the output buffer 18 and positions the devices 36 directly above the pockets of the output buffer 18. It then moves down and releases the devices 36 onto the pockets.

It is possible for the system to be used in both standalone and inline configurations. For example, the input media feeding the input buffer 12 and/or turntable 14 can be an onloader or an upstream process such as a singulation station. Similarly, the offloading transfer arm 26 can transfer devices to the output buffer 18 or to a downstream process such as laser marking or inspection before finally offloading devices to tubes or to tape-and-reel.

The invention described herein is susceptible to variations, modifications and/or additions other than those specifically described and it is to be understood that the invention includes all such variations, modifications and/or additions which fall within the spirit and scope of the above description.

What is claimed is:

1. A test handler comprising:
    a platform configured to move semiconductor devices placed on the platform from an onloading position to an offloading position along a predetermined path;
    a transfer arm located adjacent the path; and
    a plurality of transfer heads connected to the transfer arm that are configured to pick up and transfer semiconductor devices from the platform to a testing position for testing, and thereafter to transfer the semiconductor devices from the testing position to the platform for offloading.

2. A test handler as claimed in claim 1, wherein the transfer arm comprises a rotary arm.

3. A test handler as claimed in claim 2, wherein the transfer heads connected to the transfer arm are arranged on a plane that is substantially perpendicular to the predetermined path.

4. A test handler as claimed in claim 1, including a device precision station positioned such that the semiconductor devices are transferred by the transfer heads to the device precision station for alignment before they are transferred to the testing position.

5. A test handler as claimed in claim 4, wherein the transfer heads are oriented such that when one transfer head is at the testing position, another transfer head is at a position of the device precision station.

6. A test handler as claimed in claim 5, wherein the testing position and device precision station are adapted such that testing of a semiconductor device at the testing position alignment of another semiconductor device at the device precision station are carried out substantially concurrently.

7. A test handler as claimed in claim 1, wherein the transfer heads are oriented such that when one transfer head is at a position adjacent the platform, another transfer head is at the testing position.

8. A test handler as claimed in claim 1, wherein the platform comprises a turntable.

9. A test handler as claimed in claim 1, including a plurality of carriers on the platform aligned along the predetermined path, each carrier comprising multiple holders for holding multiple semiconductor devices.

10. A test handler as claimed in claim 1, wherein the transfer arm has a total of four transfer heads connected to it.

11. A test handler as claimed in claim 1, including a plurality of transfer ports connected to each transfer head, each transfer port being configured to hold one semiconductor device during transfer.

12. A test handler as claimed in claim 1, including a thermal insulation wall bounding a perimeter of substantially an area occupied by the platform.

13. A method for testing semiconductor devices with a test handler comprising the steps of:
    placing the semiconductor devices onto an onloading position of a platform;
    moving the semiconductor devices along a predetermined path;
    picking up and transferring semiconductor devices along the path from the platform to a testing position with one of a plurality of transfer heads connected to a transfer arm;
    testing the semiconductor devices;
    transferring the semiconductor devices from the testing position to the platform; and
    thereafter moving the semiconductor devices to an offloading position for removal from the platform.

14. A method as claimed in claim 13, wherein the transfer arm comprises a rotary arm.

15. A method as claimed in claim 14, wherein the transfer heads are arranged along a plane that is substantially perpendicular to the path moved by the semiconductor devices.

16. A method as claimed in claim 13, including the step of transferring the semiconductor devices to a device precision station and aligning the semiconductor devices before transferring the semiconductor devices to the testing position.

17. A method as claimed in claim 16, including testing a semiconductor device while aligning another semiconductor device for testing.

18. A method as claimed in claim 13, wherein the platform comprises a turntable.

19. A method as claimed in claim 13, including holding a plurality of semiconductor devices simultaneously during transfer to the testing position.

20. A method as claimed in claim 13, including bounding a perimeter of substantially an area occupied by the platform with a thermal insulation wall.

21. A test handler comprising:
    a platform configured to move semiconductor devices placed on the platform from an onloading position of the platform to an offloading position of the platform along a predetermined path;
    a transfer arm located adjacent the path; and
    a plurality of transfer heads connected to the transfer arm that are configured to pick up and transfer semiconductor devices from the platform to a testing position for testing, and thereafter to transfer the semiconductor devices from the testing position to the platform for offloading at the offloading position of the platform.

22. A test handler as claimed in claim 21, wherein the transfer heads connected to the transfer arm are arranged in a plane that is substantially perpendicular to a plane of the platform.

23. A method for testing semiconductor devices with a test handler comprising the steps of:
   placing the semiconductor devices onto an onloading position of a platform;
   moving the semiconductor devices on the platform along a predetermined path between the onloading position and an offloading position of the platform;
   picking up and transferring semiconductor devices along the path from the platform to a testing position with one of a plurality of transfer heads connected to a transfer arm;
   testing the semiconductor devices;
   transferring the semiconductor devices from the testing position to the platform; and thereafter
   moving the semiconductor devices to the offloading position for removal from the platform.

24. A method as claimed in claim 23, wherein the transfer heads are arranged along a plane that is substantially perpendicular to a plane of the platform.

* * * * *